(12) United States Patent
Hu

(10) Patent No.: US 12,356,842 B2
(45) Date of Patent: Jul. 8, 2025

(54) DISPLAY PANEL HAVING SUB-COLOR FILTERS, AND DISPLAY DEVICE INCLUDING THE SAME

(71) Applicant: Wuhan China Star Optoelectronics Semiconductor Display Technology Co., Ltd., Wuhan (CN)

(72) Inventor: Kai Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/776,405

(22) PCT Filed: Apr. 14, 2022

(86) PCT No.: PCT/CN2022/086745
§ 371 (c)(1),
(2) Date: May 12, 2022

(87) PCT Pub. No.: WO2023/184584
PCT Pub. Date: Oct. 5, 2023

(65) Prior Publication Data
US 2025/0017088 A1    Jan. 9, 2025

(30) Foreign Application Priority Data
Mar. 28, 2022  (CN) .......................... 202210316071.7

(51) Int. Cl.
*H10K 59/80*    (2023.01)
*H10K 59/122*    (2023.01)
(Continued)

(52) U.S. Cl.
CPC ....... *H10K 59/8792* (2023.02); *H10K 59/122* (2023.02); *H10K 59/38* (2023.02); *H10K 59/35* (2023.02)

(58) Field of Classification Search
None
See application file for complete search history.

(56) References Cited

U.S. PATENT DOCUMENTS

2016/0073076 A1*  3/2016  Carroll ................... H04N 25/62
                                                                348/242
2019/0013363 A1*  1/2019  Joo ........................ H10K 50/15
(Continued)

FOREIGN PATENT DOCUMENTS

CN    113471263 A    10/2021
CN    113485043 A    10/2021
(Continued)

OTHER PUBLICATIONS

International Search Report in International application No. PCT/CN2022/086745, mailed on Dec. 28, 2022.
(Continued)

*Primary Examiner* — Nduka E Ojeh
(74) *Attorney, Agent, or Firm* — Nathan & Associates Patent Agents Ltd.; Menachem Nathan

(57) ABSTRACT

Embodiments of the present disclosure are directed to a display device and a display device. A color filter layer includes a first sub-color filter, a second color filter and a third color filter. The first color filter includes a first sub-color filter and a second sub-color filter. The second sub-color filter is positioned between the second color filter and the third color filter. The distance between an edge of an orthogonal projection of the first sub-color filter on the pixel definition layer and a corresponding pixel opening is greater than the distance between an edge of an orthogonal projection of the second color filter and the third color filter on the pixel definition layer and a corresponding pixel opening. This could improve the shut-down color variation.

19 Claims, 9 Drawing Sheets

(51) Int. Cl.
   *H10K 59/35*          (2023.01)
   *H10K 59/38*          (2023.01)

(56) References Cited

U.S. PATENT DOCUMENTS

| | | | |
|---|---|---|---|
| 2022/0302216 A1* | 9/2022 | Hu | H10K 59/8792 |
| 2023/0157121 A1* | 5/2023 | Won | H10K 59/873 |
| | | | 257/40 |
| 2023/0200126 A1* | 6/2023 | Hyeon | H10K 50/8445 |
| | | | 257/72 |
| 2024/0049579 A1* | 2/2024 | Hu | H10K 59/873 |

FOREIGN PATENT DOCUMENTS

| | | | |
|---|---|---|---|
| CN | 113629112 A | 11/2021 | |
| CN | 113690385 A | 11/2021 | |
| CN | 113823666 A | 12/2021 | |
| CN | 114023796 A | 2/2022 | |
| CN | 114023904 A | 2/2022 | |
| KR | 20080098879 A | 11/2008 | |

OTHER PUBLICATIONS

Written Opinion of the International Search Authority in International application No. PCT/CN2022/086745, mailed on Dec. 27, 2022.

\* cited by examiner

DISPLAY PANEL HAVING SUB-COLOR FILTERS, AND DISPLAY DEVICE INCLUDING THE SAME

FIELD OF THE DISCLOSURE

The present disclosure relates to a display technology, and more particularly, to a display panel and a display device.

BACKGROUND

For a display panel used in an indoor environment without the strong ambient light, the polarizer is not often used and other light absorption materials or structures are used to replace the polarizer. For example, the color filter could be used to replace the polarizer to reduce the power consumption and cost. However, without the polarizer's reflection suppression, the display panel has a serious shut-down color variation when there are ambient light and thus the integrated black panel effect is ruined.

SUMMARY

Technical Problem

One objective of an embodiment of the present disclosure is to provide a display panel and a display device, to solve the above-mentioned shut-down color variation issue.

Technical Solution

According to an embodiment of the present disclosure, a display panel includes a substrate, a pixel definition layer positioned at one side of the substrate and provided with a plurality of pixel openings, a light emitting layer, positioned in the plurality of pixel openings, and a color filter layer, positioned at one side of the light emitting layer facing away the substrate. The light emitting layer includes a plurality of light emitting pixels. The color filter layer includes a plurality of color filters respectively corresponding to plurality of pixel openings. The color filters include a first color filter, a second color filter and a third color filter of different colors. The first color filter includes a first sub-color filter and a second sub-color filter, and the second sub-color filter is positioned between the second color filter and the third color filter. A distance between an edge of an orthogonal projection of the first sub-color filter on the pixel definition layer and a corresponding pixel opening is a first distance. A distance between an edge of an orthogonal projection of the second color filter and the third color filter on the pixel definition layer and a corresponding pixel opening is a second distance. The first distance is greater than the second distance.

Optionally, the color filter layer further comprises a black matrix positioned between two adjacent color filters of the plurality of color filters, the second sub-color filter is positioned at one side of the black matrix facing away the substrate. The first sub-color filter comprises a middle color filter and an edge color filter. An orthogonal projection of the middle color filter on the substrate covers the pixel openings. The edge color filter is positioned at one side of the black matrix facing away the substrate. An orthogonal projection of the edge color filter on the black matrix is larger than an orthogonal projection of the second color filter and the third color filter on the black matrix.

Optionally, one edge of the second sub-color filter close to the second color filter is stacked with the second color filter. One edge of the second sub-color filter close to the third color filter is stacked with the third color filter.

Optionally, a gap exists between one edge of the second sub-color filter close to the second color filter and the second color filter. A gap exists between one edge of the second sub-color filter close to the third color filter and the third color filter.

Optionally, the orthogonal projection of the first sub-color filter on the pixel definition layer has a circular shape, an oval shape or a polygon shape.

Optionally, each of the first color filter, the second color filter and the third color filter is one of a red color filter, a blue color filter and a green color filter.

Optionally, the plurality of light emitting pixels comprise a red pixel, a green pixel and a blue pixel, the red pixel is correspondingly positioned to the red color filter, the green pixel is correspondingly positioned to the green color filter, and the blue pixel is correspondingly positioned to the blue color filter; wherein the red pixel is arranged 180 degrees with the green pixel as a center, the blue pixel is arranged 180 degrees with the green pixel as a center, and the red pixel and the blue pixel are arranged in a same column or a same row at one side of the green pixel.

Optionally, a ratio range of white balance factors of the red color filter, the green color filter and the blue color filter is 1:0.40:1.35-1:0.70:2.0.

Optionally, the display panel further includes a driving circuit layer, a package layer, a touch control layer, a planarization layer, an adhesive layer, and a cover plate. The driving circuit layer is positioned between the substrate and the light emitting layer. The package layer covers one side of the light emitting layer facing away the substrate. The touch control layer is positioned at one side of the package layer facing away the substrate. The color filter layer is positioned at one side of the touch control layer facing away the substrate. The planarization layer covers one side of the color filter layer facing away the substrate. The adhesive layer is positioned at one side of the planarization layer facing away the substrate. The cover plate is positioned at one side of the adhesive layer facing away the substrate.

According to another embodiment of the present disclosure, a display panel includes a substrate, a pixel definition layer positioned at one side of the substrate and provided with a plurality of pixel openings, a light emitting layer, positioned in the plurality of pixel openings, and a color filter layer, positioned at one side of the light emitting layer facing away the substrate. The light emitting layer includes a plurality of light emitting pixels. The color filter layer includes a plurality of color filters respectively corresponding to plurality of pixel openings. The color filters include a first color filter, a second color filter and a third color filter of different colors. The first color filter includes a first sub-color filter and a second sub-color filter, and the second sub-color filter is positioned between the second color filter and the third color filter. The first color filter and the second color filter are integrally molded. A distance between an edge of an orthogonal projection of the first sub-color filter on the pixel definition layer and a corresponding pixel opening is a first distance. A distance between an edge of an orthogonal projection of the second color filter and the third color filter on the pixel definition layer and a corresponding pixel opening is a second distance. The first distance is greater than the second distance.

Optionally, the color filter layer further comprises a black matrix positioned between two adjacent color filters of the plurality of color filters, the second sub-color filter is positioned at one side of the black matrix facing away the substrate. The first sub-color filter comprises a middle color filter and an edge color filter. An orthogonal projection of the middle color filter on the substrate covers the pixel openings. The edge color filter is positioned at one side of the black matrix facing away the substrate. An orthogonal projection of the edge color filter on the black matrix is larger than an orthogonal projection of the second color filter and the third color filter on the black matrix.

Optionally, one edge of the second sub-color filter close to the second color filter is stacked with the second color filter. One edge of the second sub-color filter close to the third color filter is stacked with the third color filter.

Optionally, a gap exists between one edge of the second sub-color filter close to the second color filter and the second color filter. A gap exists between one edge of the second sub-color filter close to the third color filter and the third color filter.

Optionally, the orthogonal projection of the first sub-color filter on the pixel definition layer has a circular shape, an oval shape or a polygon shape.

Optionally, each of the first color filter, the second color filter and the third color filter is one of a red color filter, a blue color filter and a green color filter.

Optionally, the plurality of light emitting pixels comprise a red pixel, a green pixel and a blue pixel, the red pixel is correspondingly positioned to the red color filter, the green pixel is correspondingly positioned to the green color filter, and the blue pixel is correspondingly positioned to the blue color filter; wherein the red pixel is arranged 180 degrees with the green pixel as a center, the blue pixel is arranged 180 degrees with the green pixel as a center, and the red pixel and the blue pixel are arranged in a same column or a same row at one side of the green pixel.

Optionally, a ratio range of white balance factors of the red color filter, the green color filter and the blue color filter is 1:0.40:1.35-1:0.70:2.0.

Optionally, the display panel further includes a driving circuit layer, a package layer, a touch control layer, a planarization layer, an adhesive layer, and a cover plate. The driving circuit layer is positioned between the substrate and the light emitting layer. The package layer covers one side of the light emitting layer facing away the substrate. The touch control layer is positioned at one side of the package layer facing away the substrate. The color filter layer is positioned at one side of the touch control layer facing away the substrate. The planarization layer covers one side of the color filter layer facing away the substrate. The adhesive layer is positioned at one side of the planarization layer facing away the substrate. The cover plate is positioned at one side of the adhesive layer facing away the substrate.

Optionally, the display panel further comprises a fourth color filter, positioned at one side of the second color filter facing away the substrate. A refractive index of the black matrix is greater than a refractive index of the planarization layer, and a refractive index of the fourth color filter is between the refractive index of the black matrix and the refractive index of the planarization layer.

According to another embodiment of the present disclosure, a display device includes a display panel. The display panel includes a substrate, a pixel definition layer positioned at one side of the substrate and provided with a plurality of pixel openings, a light emitting layer, positioned in the plurality of pixel openings, and a color filter layer, positioned at one side of the light emitting layer facing away the substrate. The light emitting layer includes a plurality of light emitting pixels. The color filter layer includes a plurality of color filters respectively corresponding to plurality of pixel openings. The color filters include a first color filter, a second color filter and a third color filter of different colors. The first color filter includes a first sub-color filter and a second sub-color filter, and the second sub-color filter is positioned between the second color filter and the third color filter. A distance between an edge of an orthogonal projection of the first sub-color filter on the pixel definition layer and a corresponding pixel opening is a first distance. A distance between an edge of an orthogonal projection of the second color filter and the third color filter on the pixel definition layer and a corresponding pixel opening is a second distance. The first distance is greater than the second distance.

Advantageous Effect

The display device and the display device of the present disclosure have a first sub-color filter and a second color filter. The distance between an edge of an orthogonal projection of the first sub-color filter on the pixel definition layer and a corresponding pixel opening is greater than the distance between an edge of an orthogonal projection of the second color filter and the third color filter on the pixel definition layer and a corresponding pixel opening. In contrast to the conventional art, the gap between the first color filter and the second color filter/third color filter is reduced and the gap between the second color filter and the third color filter is reduced. This could reduce the output amount of the reflection light. Furthermore, the area of the first color filter is increased such that the amplitude of the reflection light is adjusted. This allows the ambient light to be combined with the white light after passing through the color filter layer and thus improves the shut-down color variation and the integrated black panel effect.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF REFERENCE SIGNS

Figure 1A:
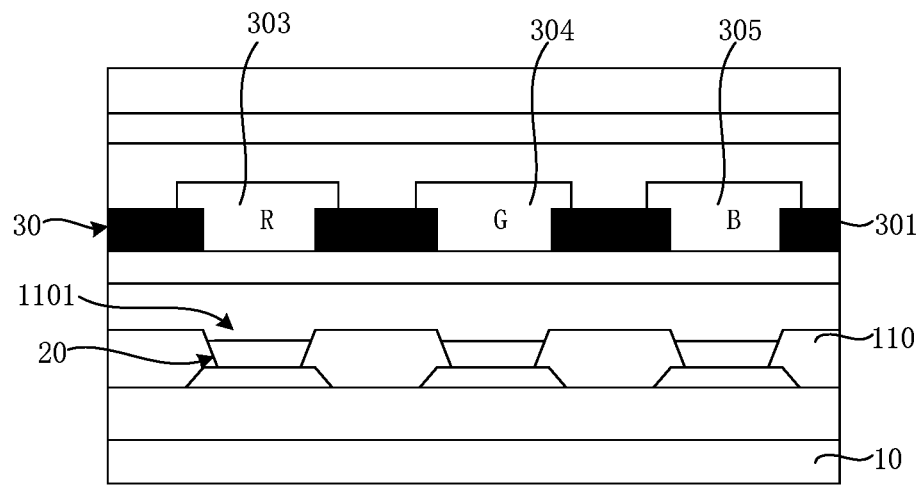
FIG. 1A is a diagram of a cross-section of a conventional display panel.

10: Substrate; 20: Light-emitting layer; 201: Red pixel; 202: Green pixel; 203: Blue pixel; 30: Color filter layer; 301: Black matrix; 302: Opening; 303: First color filter; 3031: First sub-color filter; 3031a: Middle color filter; 3031b: Edge color filter; 3032: Second sub-color filter; 304: Second color filter; 305: Third color filter; 306: Fourth color filter; 307: Fifth color filter;

40: Anode; 50: Driving circuit layer; 60: Package layer; 70: Touch control layer; 80: Planarization layer; 90: Adhesive layer; 100: Cover plate; 110: Pixel definition layer; 1101: Pixel opening.

DETAILED DESCRIPTION

To help a person skilled in the art better understand the solutions of the present disclosure, the following clearly and completely describes the technical solutions in the embodiments of the present disclosure with reference of the accompanying drawings in the embodiments of the present disclosure. Apparently, the described embodiments are a part rather than all of the embodiments of the present disclosure. All other embodiments obtained by a person of ordinary skill in the art based on the embodiments of the present disclosure without creative efforts shall fall within the protection scope of the present disclosure. It should be understood that the specific embodiments described herein are only used to illustrate and explain the present application, but not to limit the present application. In this application, unless otherwise stated, the directional words used such as "upper" and "lower" generally refer to the upper and lower parts of the device in actual use or working state, specifically the direction of the drawing in the drawings; while "inside" and "outside" refer to the outline of the device.

Figure 1B:
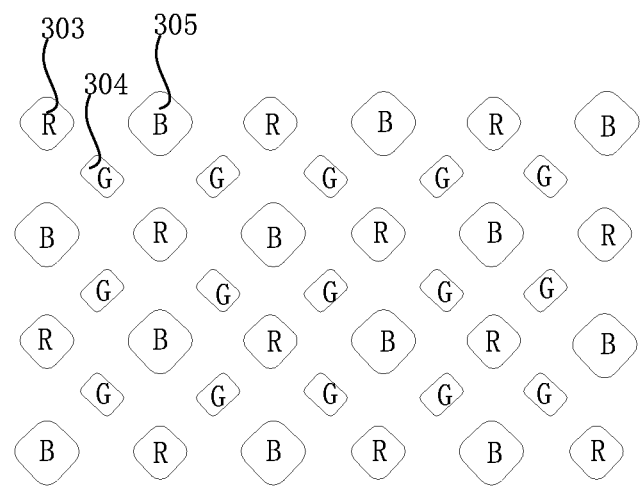
FIG. 1B is a top view of the conventional display panel.

Please refer to FIG. 1A and FIG. 1B. The conventional display panel comprises a substrate 10, a pixel definition layer 110, a light emitting layer 20 and a color filter layer 30. The conventional display panel uses the color filter layer 30 to replace the polarizer to reduce the power consumption and the cost. The color filter layer 30 comprises a plurality of color filters and a plurality of black matrixes 301. The black matrixes 301 are placed between two adjacent color filters. The color filters comprise the first color filter 303, the color filter 304 and the color filter 305 of different colors. The first color filter 303 is a red color filter. The second color filter 304 is a green color filter. The third color filter 305 is a blue color filter. There is no color filter of the same color or a different color positioned between two adjacent color filters. That is, the first color filter 303 and the second color filter 304 adjacent to each other do not have any other color filter in-between. The first color filter 303 and the third color filter 305 adjacent to each other do not have any other color filter in-between. However, without the polarizer's reflection suppression, the conventional display panel has a serious shut-down color variation when there are ambient light and thus the integrated black panel effect is ruined.

Figure 2A:
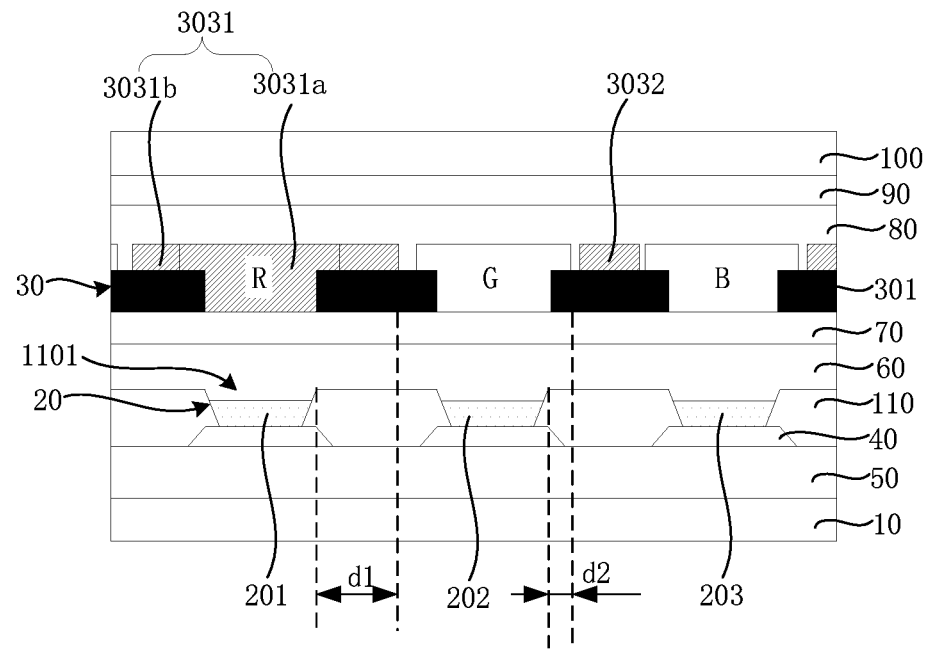
FIG. 2A is a diagram of a cross-section of a display panel according to a first embodiment of the present disclosure.
Figure 2B:
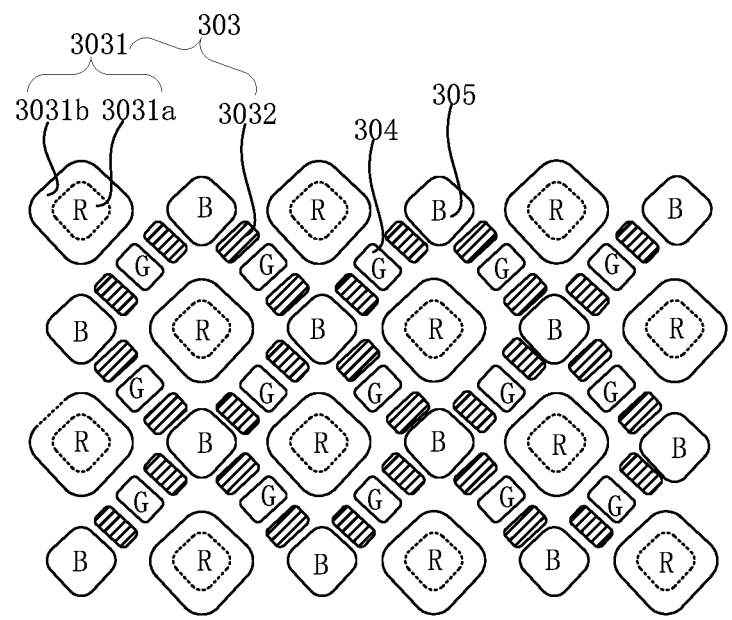
FIG. 2B is a top view of the display panel shown in FIG. 2A.

Please refer to FIG. 2A and FIG. 2B. A display panel is disclosed according to a first embodiment of the present disclosure. The display panel comprises a substrate 10, a pixel definition layer 110, a light emitting layer 20 and a color filter layer 30. The pixel definition layer 110 is positioned at one side of the substrate 10. The pixel definition layer 110 defines a plurality of pixel openings 1101. The light emitting layer 20 is positioned in the plurality of pixel openings 1101. The emitting layer 20 comprises a plurality of light emitting pixels. The color filter layer 30 is positioned at one side of the light emitting layer 20 facing away the substrate 10. The color filter layer 30 comprises a plurality of color filters respectively corresponding to plurality of pixel openings 1101. The plurality of color filters comprise a first color filter 303, a second color filter 304 and a third color filter 305 of different colors. The first color filter comprises a first sub-color filter 3031 and a second sub-color filter 3032, and the second sub-color filter 3032 is positioned between the second color filter 304 and the third color filter 305.

The display panel further comprises an anode 40. The anode 40 is positioned between the substrate 10 and the light emitting layer 20. It could be understood that when the display panel uses the color filter 30 to replace the polarizer, the ambient light is reflected by the metal wires of the anode 40 and outputted through the color filter layer 30 because there is no suppression from the polarizer. The reflection light becomes a single-color light of the color of the first color filter 303 after it passes through the first color filter 303. The reflection light becomes a single-color light of the color of the second color filter 304 after it passes through the second color filter 304. The reflection light becomes a single-color light of the color of the third color filter 305 after it passes through the third color filter 305. The reflection light of three different colors is combined but the combined light normally has a color shift.

Each of the color filters and its corresponding pixel opening 1101 are correspondingly positioned. Or the area of the color filter is slightly larger than the area of the corresponding pixel opening 1101. That is, the distance between the edge of the orthogonal projection of each color filter on the pixel definition layer 110 and the pixel opening 1101 is greater than or equal to 0. However, the difference between this embodiment and the conventional display panel is: The first color filter 303 comprises the first sub-color filter 3031 and the second sub-color filter 2032. A distance between an edge of an orthogonal projection of the first sub-color filter on the pixel definition layer 110 and its corresponding pixel opening is a first distance. A distance between an edge of an orthogonal projection of the second color filter and the third color filter on the pixel definition layer and their corresponding pixel opening is a second distance. The first distance is greater than the second distance. That is, the gap between the first color filter 303 and the second color filter 304 and the third color filter 305 is smaller. The gap between the second color filter 304 and the third color filter 305 is smaller. This reduces the amount of the output reflection light and thus reduces the reflection of the ambient light.

Furthermore, the area of the first sub-color filter 3031 is larger than the area of the conventional first color filter 303, which means that the area of the first color filter 303 is increased. Furthermore, the second sub-color filter 3032 is positioned between the second color filter 304 and the third color filter 305. It can be regarded as filling up the space with the second sub-color filter 3032 between the second color filter 304 and the third color filter 305. This further increases the area of the first color filter 303 and could reduce the output amount of the reflection light and adjust the amplitude of the reflection light. In this way, the reflected ambient light passing through the color filter layer 30 could be combined as a white light and thus the shut-down color variation and the integrated black panel effect could be improved.

In addition, the color filter layer 30 further comprises a black matrix 301. The second sub-color filter 3032 is positioned at one side of the black matrix 301 facing away the substrate 10. The first sub-color filter 3031 comprises a middle color filter 3031a and an edge color filter 3031b. The orthogonal projection of the middle color filter 3031a on the substrate 10 covers the pixel opening 1101. The edge color filter 3031b is positioned at one side of the black matrix 301 facing away the substrate 10. Here, the orthogonal projection of the edge color filter 3031b on the black matrix 301 is larger than the orthogonal projection of the second color filter 304 and the third color filter 305 on the black matrix 301.

Conventionally, due to the manufacturing process, a part of each color filter (the middle color filter) covers the pixel opening 1101 and another part of the color filter (the edge color filter) covers the black matrix 301. However, the area of the color filter (the edge color filter) covering the black matrix 301 is not large and the size of the part of each color filter covering the black matrix 301 is almost equal. However, unlike the conventional display panel, in this embodiment, the part of the first color filter 303 covering the black matrix 301 is larger than the part of the second color filter 304 and the third color filter 305 covering the black matrix 301. This equivalently increases the area of the first color filter 303 and improves the shut-down color variation.

Conventionally, when the conventional display panel is shut down, the display panel has a color shift so that the color of the display panel has a reserved color or a color close to the reversed color of the first color filter 303. In the following disclosure, in order to illustrate the present disclosure, we assume that the same phenomenon will occur if no action is taken.

In this embodiment, each of the first color filter 303, the second color filter 304 and the third color filter 305 is one of a red color filter R, a blue color filter B and a green color filter G. The actual color of the first color filter 303 could be determined according to the color shift phenomenon when the display panel is shut down. Different conditions will be explained in the following disclosure:

Under the condition that the color of the display panel when the display panel is shut down is close to green or cyan, the first color filter 303 is a red color filter R, the second color filter 304 is one of the green color filter G and the blue color filter B, and the third color filter 305 is the other of the green color filter G and the blue color filter B. Under the condition that the color of the display panel when the display panel is shut down is close to red or pink, the first color filter 303 is a green color filter G, the second color filter 304 is one of the red color filter R and the blue color filter B, and the third color filter 305 is the other of the red color filter R and the blue color filter B. Under the condition that the color of the display panel when the display panel is shut down is close to blue or yellow, the first color filter 303 is a blue color filter B, the second color filter 304 is one of the red color filter R and the green color filter G, and the third color filter 305 is the other of the red color filter R and the green color filter G.

Please refer to FIG. 2A and FIG. 2B. This embodiment is under the condition that the color of the display panel when the display panel is shut down is close to green or cyan and thus the first color filter 303 is a red color filter R, the second color filter 304 is a green color filter G and the third color filter 305 is a blue color filter B. Here, the red color filter R comprises the first sub-color filter 3031 and the second sub-color filter 3032. In contrast to the conventional art, the gap between the red color filter R and the green color filter G and the blue color filter B is reduced. The second sub-color filter 3032 is additionally positioned between the green color filter G and the blue color filter B. The color of the second sub-color filter 3032 and the first sub-color filter 3031 is red such that the distance between the green color filter G and the blue color filter B is reduced. On one hand, it reduces the size of the opening between the red color filter R and the green color filter G and the blue color filter B and also reduces the size of the opening between the green color filter G and the blue color filter B. In this way, the output amount of the reflection light is reduced and thus the reflection of the ambient light is reduced. On the other hand, it increases the area of the red color filter R in the color filter layer 30 such that the amount of the reflection light reflected from the anode 40 and passing through the red color filter R is increased. This increases the amplitude of the red light and reduces the ratio of the green light and the blue light in the reflection light. In this way, it could offset a part of green/cyan light such that the light of three colors could be combined into a white light and thus improve the shut-down color variation and integrated black panel effect.

Figure 3A:
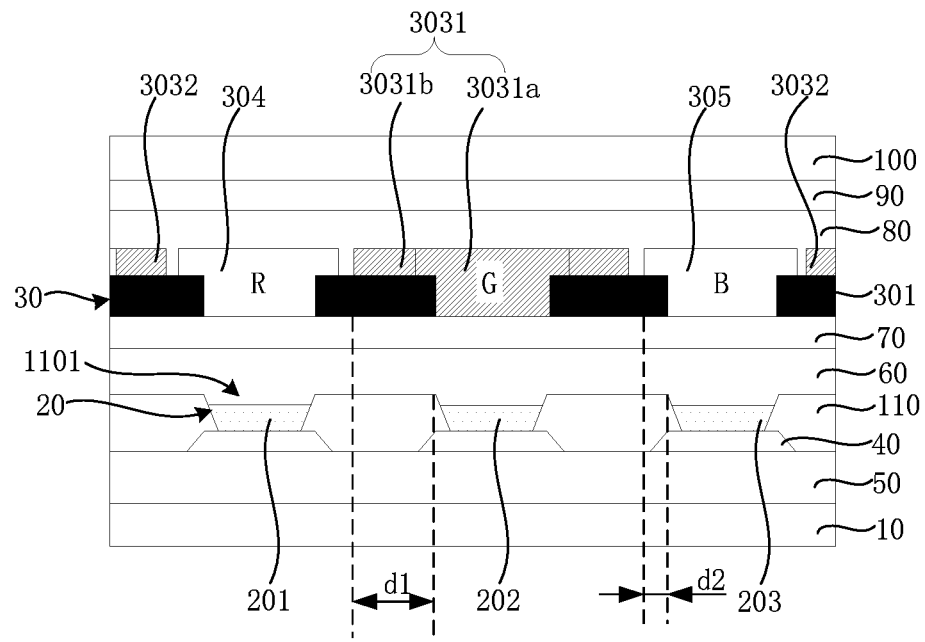
FIG. 3A is a diagram of a cross-section of a display panel according to a second embodiment of the present disclosure.
Figure 3B:
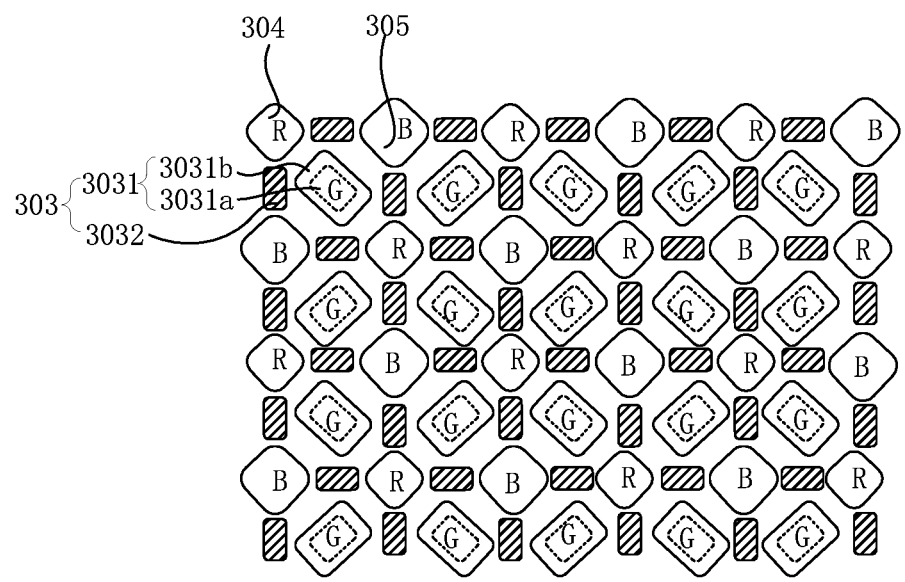
FIG. 3B is a top view of the display panel shown in FIG. 3A.

Please refer to FIG. 3A and FIG. 3B. The difference between FIG. 3A and FIG. 2A and between FIG. 3B and FIG. 2B is: this embodiment is under the condition that the color of the display panel when the display panel is shut down is close to red or pink and thus the first color filter 303 is a green color filter G, the second color filter 304 is a red color filter R and the third color filter 305 is a blue color filter B. Here, the green color filter G comprises the first sub-color filter 3031 and the second sub-color filter 3032. In contrast to the conventional art, the gap between the green color filter G and the red color filter R and the blue color filter B is reduced. The second sub-color filter 3032 is additionally positioned between the red color filter R and the blue color filter B. The color of the second sub-color filter 3032 and the first sub-color filter 3031 is green such that the distance between the red color filter R and the blue color filter B is reduced. On one hand, it reduces the size of the opening between the green color filter G and the red color filter R and the blue color filter B and also reduces the size of the opening between the red color filter R and the blue color filter B. In this way, the output amount of the reflection light is reduced and thus the reflection of the ambient light is reduced. On the other hand, it increases the area of the green color filter G in the color filter layer 30 such that the amount of the reflection light reflected from the anode 40 and passing through the green color filter G is increased. This increases the amplitude of the green light and reduces the ratio of the red light and the blue light in the reflection light. In this way, it could offset a part of red/pink light such that the light of three colors could be combined into a white light and thus improve the shut-down color variation and integrated black panel effect.

Figure 4A:
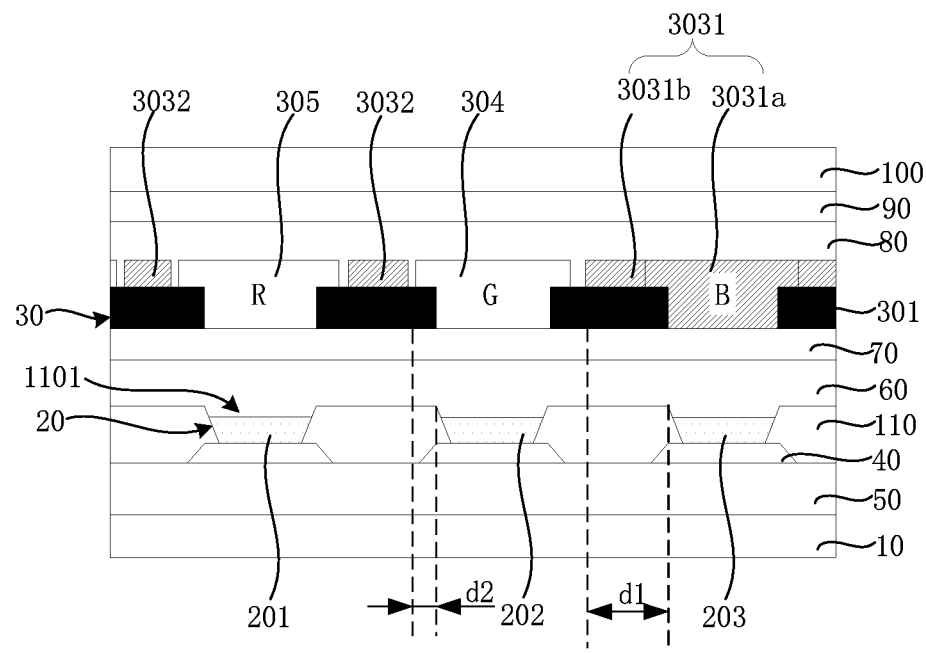
FIG. 4A is a diagram of a cross-section of a display panel according to a third embodiment of the present disclosure.
Figure 4B:
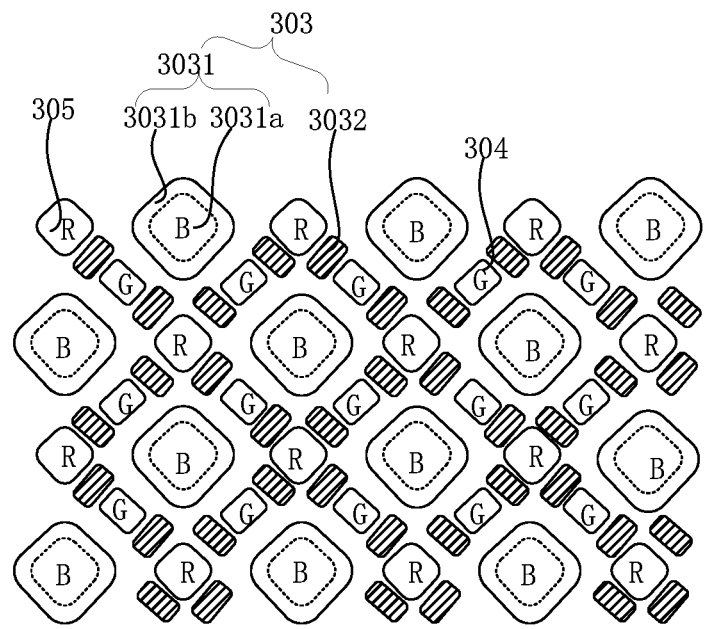
FIG. 4B is a top view of the display panel shown in FIG. 4A.

Please refer to FIG. 4A and FIG. 4B. The difference between FIG. 4A and FIG. 2A and between FIG. 4B and FIG. 2B is: this embodiment is under the condition that the color of the display panel when the display panel is shut down is close to blue or yellow and thus the first color filter 303 is a blue color filter B, the second color filter 304 is a red color filter R and the third color filter 305 is a green color filter G. Here, the blue color filter B comprises the first sub-color filter 3031 and the second sub-color filter 3032. In contrast to the conventional art, the gap between the blue color filter B and the red color filter R and the green color filter G is reduced. The second sub-color filter 3032 is additionally positioned between the red color filter R and the green color filter G. The color of the second sub-color filter 3032 and the first sub-color filter 3031 is blue such that the distance between the red color filter R and the green color filter G is reduced. On one hand, it reduces the size of the opening between the blue color filter B and the red color filter R and the green color filter G and also reduces the size of the opening between the red color filter R and the green color filter G. In this way, the output amount of the reflection light is reduced and thus the reflection of the ambient light is reduced. On the other hand, it increases the area of the blue color filter B in the color filter layer 30 such that the amount of the reflection light reflected from the anode 40 and passing through the blue color filter B is increased. This increases the amplitude of the blue light and reduces the ratio of the red light and the green light in the reflection light. In this way, it could offset a part of blue/yellow light such that the light of three colors could be combined into a white light and thus improve the shut-down color variation and integrated black panel effect.

Because the color of the first sub-color filter 3031 and the color of the second sub-color filter 3032 are the same, the first sub-color filter 3031 and the second sub-color filter 3032 are integrally molded. That is, the first sub-color filter 3031 and the second sub-color filter 3032 could be manufactured in the same manufacturing process step. This could reduce the process steps and the cost.

When the second sub-color filter 3032 is positioned between the second color filter 304 and the third color filter 305, because the colors of the second sub-color filter 3032, the second color filter 304 and the third color filter 305 are different, the second sub-color filter 3032, the second color filter 304 and the third color filter 305 are manufactured in different process steps. In order to prevent the second sub-color filter 3032 from stacking on the second color filter 304 and the third color filter 305, which may form a horn phenomenon, there is a gap between the edge of the second sub-color filter 3032 close to the second color filter 304 and the second color filter 304, and there is a gap between the edge of the second sub-color filter 3032 close to the third color filter 305 and the third color filter 305.

In another embodiment, one edge of the second sub-color filter 3032 close to the second color filter 304 is stacked with the second color filter 304. And one edge of the second sub-color filter 3032 close to the third color filter 305 is stacked with the third color filter 305.

The orthogonal projection of the first sub-color filter 3031 on the pixel definition layer 110 has a circular shape, an oval shape or a polygon shape.

Preferably, in order to ensure the improvement of the shut-down color variation and integrated black panel effect, the second sub-color filter 3032 could be fully filled up with the gap between the second color filter 304 and the third color filter 305.

The color shift of the display panel is related to the arrangement of the light emitting pixels. In this embodiment, each of the pixel unit comprises a plurality of light emitting pixels. The plurality of light emitting pixels comprise a red pixel 201, a green pixel 202 and a blue pixel 203. The red pixel 201 is correspondingly positioned to the first color filter 303, the green pixel 202 is correspondingly positioned to the second color filter 304, and the blue pixel 203 is correspondingly positioned to the third color filter 305. The red pixel 201 is arranged 180 degrees with the green pixel 202 as a center, the blue pixel 203 is arranged 180 degrees with the green pixel 202 as a center, and the red pixel 201 and the blue pixel 203 are arranged in a same column or a same row at one side of the green pixel 202.

Please note, the above-mentioned arrangement of the pixels is only an embodiment, not a limitation of the present disclosure. In the actual implementation, other arrangements could be used and these changes also fall within the scope of the present disclosure.

Figure 5:
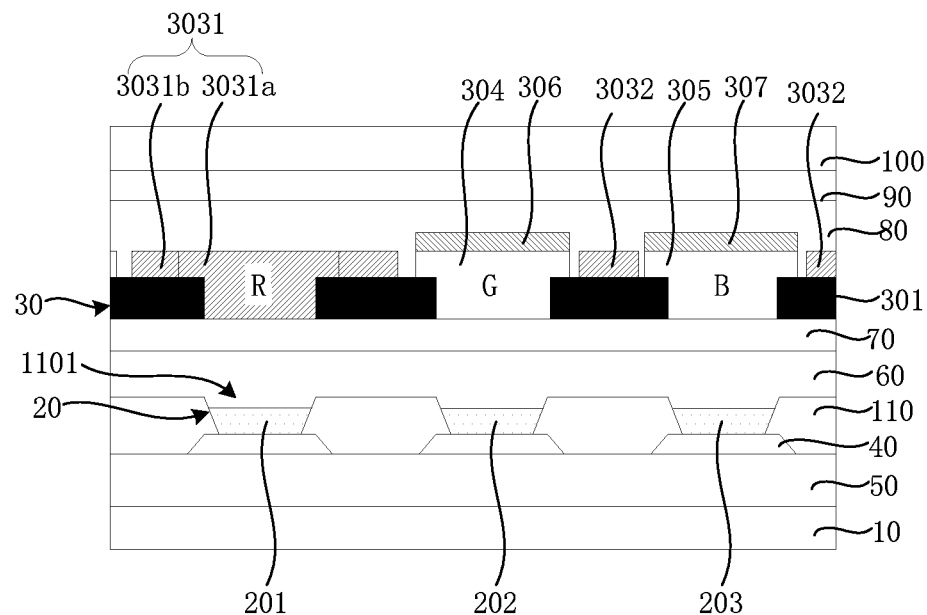
FIG. 5 is a diagram of a cross-section of a display panel according to a fourth embodiment of the present disclosure.
Figure 6:
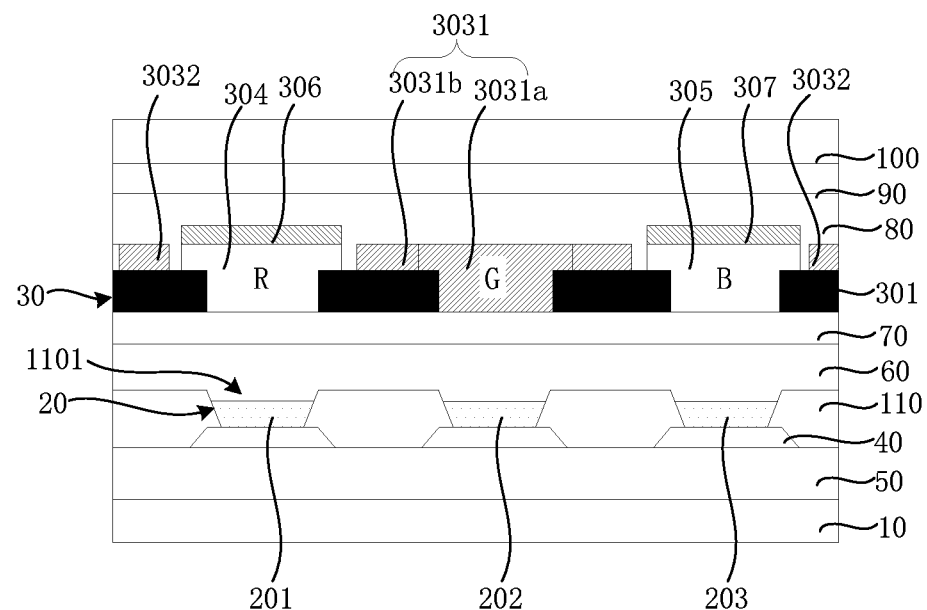
FIG. 6 is a diagram of a cross-section of a display panel according to a fifth embodiment of the present disclosure.
Figure 7:
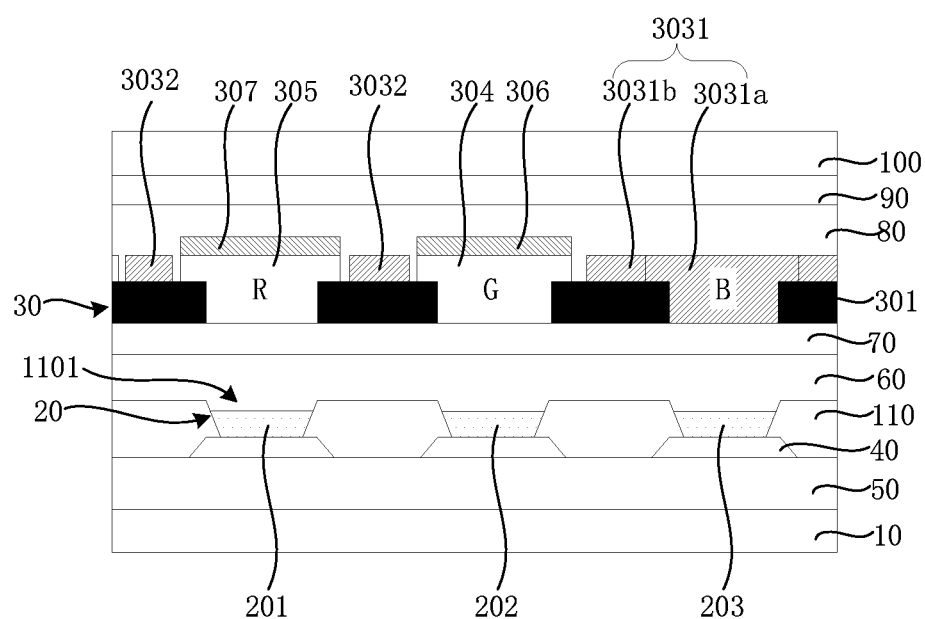
FIG. 7 is a diagram of a cross-section of a display panel according to a sixth embodiment of the present disclosure.

Please refer to FIGS. 5-7. Because the reflection rate of the color filter is related to its transparent rate and the transparent rate is reserved proportional to its thickness, a fourth color filter 306 is positioned at one side of the second color filter 304 facing away the substrate 10. The color of the fourth color filter 306 is the same as the color of the second color filter 304. The fourth color filter 306 is stacked with the second color filter 304, which equivalently increases the thickness of the second color filter 304, so that the ratio of the reflection light passing through the second color filter 304 is reduced. Similarly, a fifth color filter 307 could be positioned at one side of the third color filter 305 facing away the substrate 10. The color of the fifth color filter 307 is the same as the third color filter 305. The fifth color filter 307 is stacked with the third color filter 305, which equivalently increases the thickness of the third color filter 305, so that the ratio of the reflection light passing through the third color filter 305 is reduced.

By including the fourth color filter 306 and the fifth color filter 307, the ratio of the green light and the blue light in the reflection light passing through the color filter layer 30 are reduced. This means that the ratio of the red light in the reflection light passing through the color filter layer 30 is increased. This could effectively adjust the color shift and improves the shut-down color variation and integrated black panel effect.

Please refer to FIG. 5. The difference between FIG. 5 and FIG. 2A is: the fourth color filter 306 is positioned at one side of the second color filter 304 facing away the substrate 10 and the fifth color filter 307 is positioned at one side of the third color filter 305 facing away the substrate 10. The fourth color filter 306 is a green color filter G, and the fifth color filter 307 is a blue color filter B. Accordingly, the ratio of the green light and the blue light in the reflection light passing through the color filter layer 30 are reduced. This means that the ratio of the red light in the reflection light passing through the color filter layer 30 is increased. This could effectively adjust the color shift and improves the shut-down color variation and integrated black panel effect.

Please refer to FIG. 6. The difference between FIG. 6 and FIG. 2A is: the fourth color filter 306 is positioned at one side of the second color filter 304 facing away the substrate 10 and the fifth color filter 307 is positioned at one side of the third color filter 305 facing away the substrate 10. The fourth color filter 306 is a red color filter R, and the fifth color filter 307 is a blue color filter B. Accordingly, the ratio of the red light and the blue light in the reflection light passing through the color filter layer 30 are reduced. This means that ratio of the green light in the reflection light t passing through the color filter layer 30 is increased. This could effectively adjust the color shift and improves the shut-down color variation and integrated black panel effect.

Please refer to FIG. 7. The difference between FIG. 7 and FIG. 2A is: the fourth color filter 306 is positioned at one side of the second color filter 304 facing away the substrate 10 and the fifth color filter 307 is positioned at one side of the third color filter 305 facing away the substrate 10. The fourth color filter 306 is a green color filter G, and the fifth color filter 307 is a red color filter R. Accordingly, the ratio of the red light and the green light in the reflection light passing through the color filter layer 30 are reduced. This means that ratio of the blue light in the reflection light passing through the color filter layer 30 is increased. This could effectively adjust the color shift and improves the shut-down color variation and integrated black panel effect.

Furthermore, because the white balance factor is a product of the surface area of the side of the color filter facing away the substrate 10 times the maximum of the transparent rate of the color filter, in this embodiment, the white balance factor is adjusted to further improve the shut-down color variation and integrated black panel effect. In addition, the way of adjusting the white balance factor is easier to operate and quantize. It is applicable and easy to implement.

Specifically, under the condition that the first color filter 303 is a red color filter R, the second color filter 304 is a green color filter G, and the third color filter 305 is a blue color filter B. The ratio range of white balance factors of the red color filter, the green color filter and the blue color filter is 1:0.40:1.35-1:0.70:2.0. By adjusting the white balance factors of the color filters in this range, the technical effect of this embodiment could be met.

Please refer to FIG. 2A, FIG. 3A, FIG. 4A and FIGS. 5-7. The display panel further comprises a driving circuit layer 50, a package layer 60, a touch control layer 70, a planarization layer 80, an adhesive layer 90 and a cover plate 100. The driving circuit layer 50 is positioned between the substrate 10 and the light emitting layer 20. The package layer 60 covers one side of the light emitting layer 20 facing away the substrate 10. The touch control layer 70 is positioned at one side of the package layer 60 facing away the substrate 10. The color filter layer 30 is positioned at one side of the touch control layer 70 facing away the substrate 10. The planarization layer 80 covers one side of the color filter layer 30 facing away the substrate 10. The adhesive layer 90 is positioned at one side of the planarization layer 80 facing away the substrate 10. The cover plate 100 is positioned at one side of the adhesive layer 90 facing away the substrate 10.

The refractive index of the black matrix 301 is greater than the refractive index of the planarization layer 80, and the refractive index of the fourth color filter 306 is between the refractive index of the black matrix 301 and the refractive index of the planarization layer 80. In this way, the reflection light reflected by the anode 40 will be reflected again at the interface between the black matrix 301 and the fourth color filter 306 and the interface between the fourth color filter 306 and the planarization layer 80. This reduces the output amount of the reflection light and improves the shut-down color variation and integrated black panel effect.

In this embodiment, the display panel further comprises a pixel definition layer 110. The pixel definition 110 defines several openings 1101. The light emitting layer 20 is positioned in the pixel openings 1101. The pixel openings 1101 expose a part of the anode 40 such that the anode 40 contacts the light emitting layer 20.

Please refer to FIGS. 8A-8G. FIGS. 8A-8G depict a manufacturing process of a display panel according to an embodiment of the present disclosure. The display panel manufacturing process in this embodiment comprises following steps:

S10: providing a substrate 10.

Figure 8A:
FIGS. 8A-8G depict a manufacturing process of a display panel according to an embodiment of the present disclosure.

Please refer to FIG. 8A. The substrate 10 could be a solid substrate 10. For example, the solid substrate 10 could comprise a glass substrate 10 or PMMA (Polymethyl methacrylate). The substrate 10 could be a flexible substrate 10. For example, the flexible substrate 10 could be PET (Polyethylene terephthalate).

S20: forming a light emitting layer 20 at one side of the substrate. The light emitting layer 20 comprises a plurality of light emitting pixels.

Figure 8B:
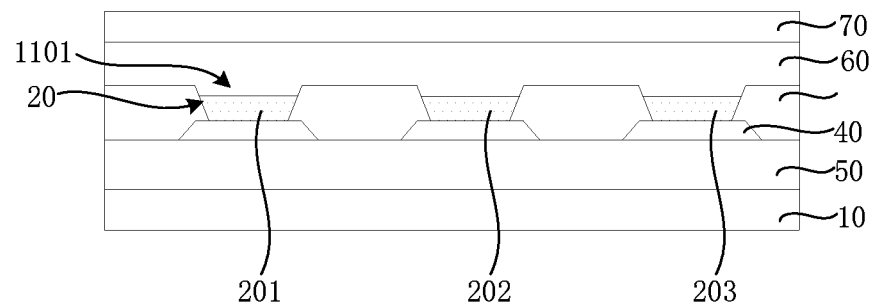
Figure 8C:
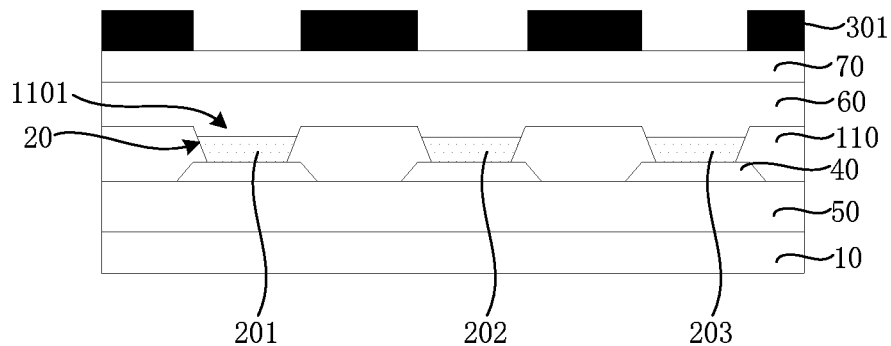
Figure 8D:
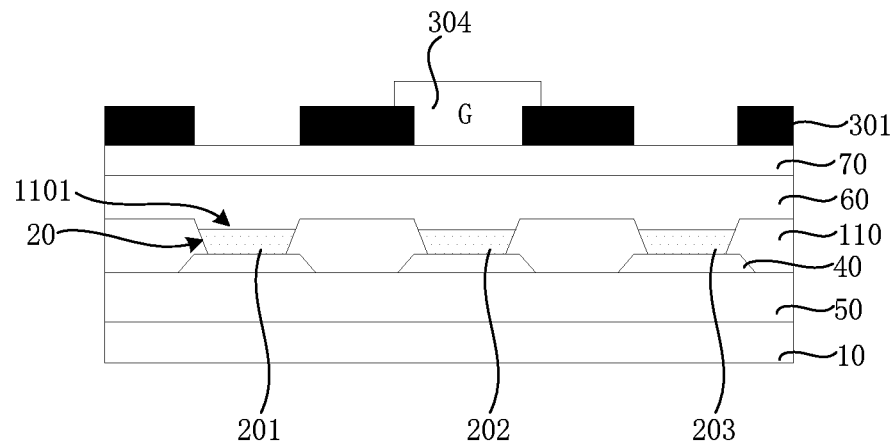
Figure 8E:
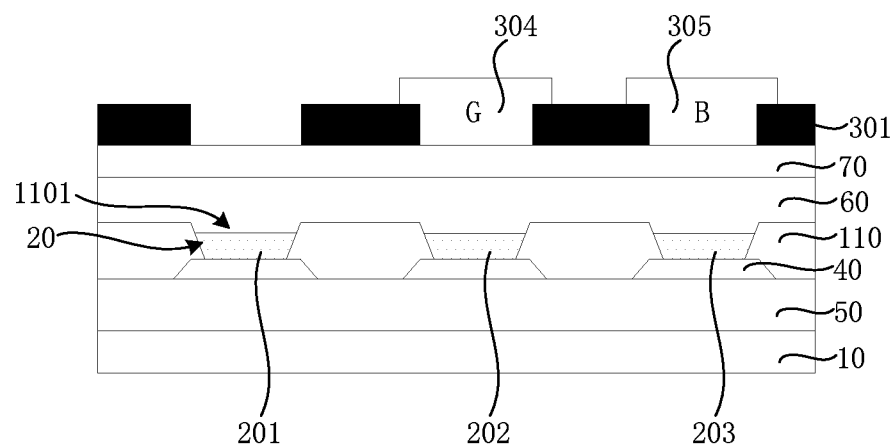
Figure 8F:
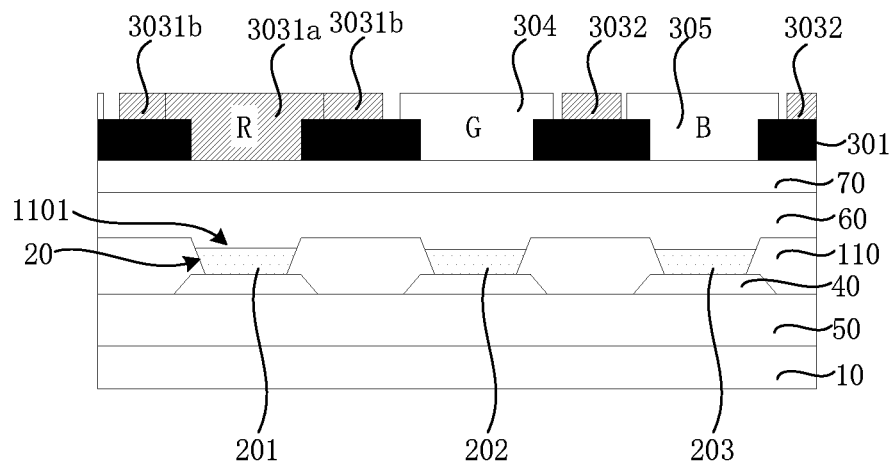

Please refer to FIG. 8B. The step S20 further comprises:
forming a driving circuit layer 50 on the substrate 10;
forming an anode 40 on the driving circuit layer 50;
forming a pixel definition layer 110 at one side of the driving circuit layer 50 and
the anode 40 facing away the substrate 10, where the pixel definition layer 110 defines a plurality of pixel openings 1101;
forming a light emitting layer 20 in the pixel openings 110, wherein the light emitting layer 20 comprises a red pixel 201, a green pixel 202 and a blue pixel 203;
forming a package layer 60 at one side of the light emitting layer 20 facing away the substrate 10;
forming a touch control layer 70 at one side of the package layer 60 facing away the substrate 10.

S30: forming a color filter layer 30 at one side of the light emitting layer 20 facing away 10. The color filter layer 30 comprises a plurality of color filters, which one-to-one correspond to the pixel openings 1101. The plurality of color filters are positioned in one-to-one correspondences to the light emitting pixels. The plurality of color filters at least comprise the first color filter 303, the second color filter 304 and the third color filter 305 of different colors. The first color filter 303 comprises the first sub-color filter 3031 and the second sub-color filter 3032. The second sub-color color filter 3032 is positioned between the second color filter 304 and the third color filter 305.

Please refer to FIG. 8C, FIG. 8D, FIG. 8E and FIG. 8F. As an example, the first color filter 303 is a red color filter R, the second color filter 304 is a green color filter G, and the third color filter 305 is a blue color filter G. The step S30 comprises the following steps:
forming a plurality of black matrixes 301 at one side of the touch control layer 70 facing away 10;
forming the second color filter 304 in a partial gap of the black matrixes 301 in one lithography process step, wherein the second color filter 304 corresponds to the green pixel 202;
forming the third color filter 305 in a partial gap of the black matrixes 301 in one lithography process step, wherein the third color filter 305 corresponds to the blue pixel 203;
forming the first color filter 301 and the fourth color filter 306 in a partial gap of the black matrixes 301 in one lithography process step, wherein the first color filter 301 and the fourth color filter 306 correspond to the blue pixel 203.

Figure 8G:
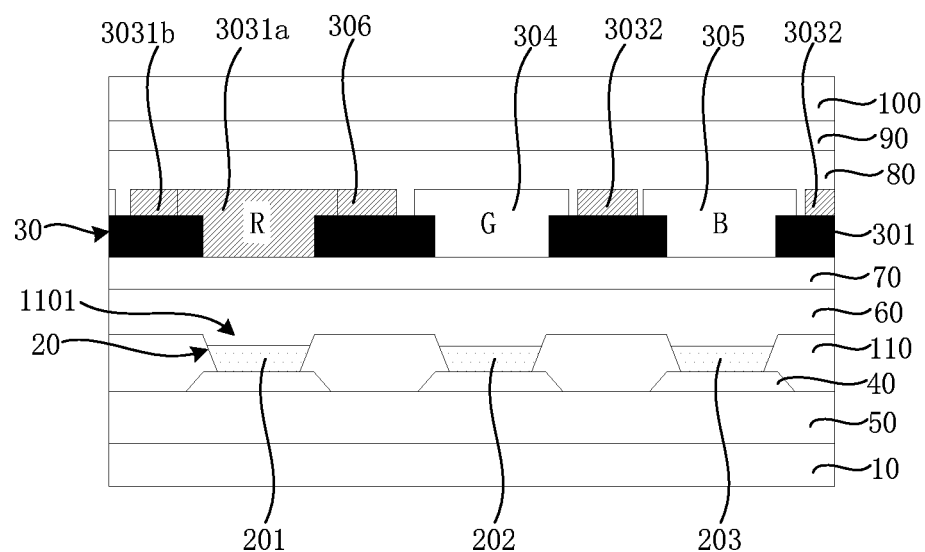

Please refer to FIG. 8G. After the step S30, the manufacturing process further comprises following steps:
forming a planarization layer 80 at one side of the color filter layer 30 facing away the substrate 10;
forming an adhesive layer 90 at one side of the planarization layer 80 facing away substrate 10;
pasting the cover plate 100 on one side of the adhesive layer 90 facing away the substrate 10.

According to an embodiment of the present disclosure, a display device is disclosed. The display device comprises the above-mentioned display panel of any of the above embodiments. The display device comprises a fixed terminal such as a TV or a desktop, a mobile terminal such as a cell phone or a laptop, and a wearable device such as a wristband, a virtual reality (VR) device or an augmented reality (AR) device.

The display device and the display device of the present disclosure have a first sub-color filter and a second color filter. The distance between an edge of an orthogonal projection of the first sub-color filter on the pixel definition layer and a corresponding pixel opening is greater than the distance between an edge of an orthogonal projection of the second color filter and the third color filter on the pixel definition layer and a corresponding pixel opening. In contrast to the conventional art, the gap between the first color filter and the second color filter/third color filter is reduced and the gap between the second color filter and the third color filter is reduced. This could reduce the output amount of the reflection light. Furthermore, the area of the first color filter is increased such that the amplitude of the reflection light is adjusted. This allows the ambient light to be combined with the white light after passing through the color filter layer and thus improves the shut-down color variation and the integrated black panel effect.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
a substrate;
a pixel definition layer, positioned at one side of the substrate and provided with a plurality of pixel openings;
a light emitting layer, positioned in the plurality of pixel openings, the light emitting layer comprising a plurality of light emitting pixels;
a color filter layer, positioned at one side of the light emitting layer facing away the substrate, the color filter layer comprising a plurality of color filters respectively corresponding to plurality of pixel openings, the plurality of color filters comprising a first color filter, a second color filter and a third color filter of different colors, the first color filter comprising a first sub-color filter and a second sub-color filter, and the second sub-color filter is positioned between the second color filter and the third color filter;
a planarization layer, covering one side of the color filter layer facing away the substrate; and
a fourth color filter, positioned at one side of the second color filter facing away the substrate;
wherein a distance between an edge of an orthogonal projection of the first sub-color filter on the pixel definition layer and a corresponding pixel opening is a first distance; a distance between an edge of an orthogonal projection of the second color filter and the third color filter on the pixel definition layer and a corresponding pixel opening is a second distance; and the first distance is greater than the second distance;
wherein a refractive index of the black matrix is greater than a refractive index of the planarization layer, and a refractive index of the fourth color filter is between the refractive index of the black matrix and the refractive index of the planarization layer.

2. The display panel of claim 1, wherein the color filter layer further comprises a black matrix positioned between two adjacent color filters of the plurality of color filters, the second sub-color filter is positioned at one side of the black matrix facing away the substrate; the first sub-color filter comprises a middle color filter and an edge color filter, an orthogonal projection of the middle color filter on the substrate covers the pixel openings, the edge color filter is positioned at one side of the black matrix facing away the substrate;
wherein an orthogonal projection of the edge color filter on the black matrix is larger than an orthogonal projection of the second color filter and the third color filter on the black matrix.

3. The display panel of claim 2, wherein one edge of the second sub-color filter close to the second color filter is stacked with the second color filter; and one edge of the second sub-color filter close to the third color filter is stacked with the third color filter.

4. The display panel of claim 2, wherein a gap exists between one edge of the second sub-color filter close to the second color filter and the second color filter; and a gap exists between one edge of the second sub-color filter close to the third color filter and the third color filter.

5. The display panel of claim 1, wherein the orthogonal projection of the first sub-color filter on the pixel definition layer has a circular shape, an oval shape or a polygon shape.

6. The display panel of claim 1, wherein each of the first color filter, the second color filter and the third color filter is one of a red color filter, a blue color filter and a green color filter.

7. The display panel of claim 6, wherein the plurality of light emitting pixels comprise a red pixel, a green pixel and a blue pixel, the red pixel is correspondingly positioned to the red color filter, the green pixel is correspondingly positioned to the green color filter, and the blue pixel is correspondingly positioned to the blue color filter; wherein the red pixel is arranged 180 degrees with the green pixel as a center, the blue pixel is arranged 180 degrees with the green pixel as a center, and the red pixel and the blue pixel are arranged in a same column or a same row at one side of the green pixel.

8. The display panel of claim 7, wherein a ratio range of white balance factors of the red color filter, the green color filter and the blue color filter is 1:0.40:1.35-1:0.70:2.0.

9. The display panel of claim 1, further comprising:
a driving circuit layer, positioned between the substrate and the light emitting layer;
a package layer, covering one side of the light emitting layer facing away the substrate;
a touch control layer, positioned at one side of the package layer facing away the substrate, wherein the color filter layer is positioned at one side of the touch control layer facing away the substrate;
an adhesive layer, positioned at one side of the planarization layer facing away the substrate; and
a cover plate, positioned at one side of the adhesive layer facing away the substrate.

10. A display panel, comprising:
a substrate;
a pixel definition layer, positioned at one side of the substrate and provided with a plurality of pixel openings;
a light emitting layer, positioned in the plurality of pixel openings, the light emitting layer comprising a plurality of light emitting pixels;
a color filter layer, positioned at one side of the light emitting layer facing away the substrate, the color filter layer comprising a plurality of color filters respectively corresponding to plurality of pixel openings, the plurality of color filters comprising a first color filter, a second color filter and a third color filter of different colors, the first color filter comprising a first sub-color filter and a second sub-color filter, and the second sub-color filter is positioned between the second color filter and the third color filter; the first sub-color filter and the second sub-color filter are integrally molded;
a planarization layer, covering one side of the color filter layer facing away the substrate; and
a fourth color filter, positioned at one side of the second color filter facing away the substrate;
wherein a distance between an edge of an orthogonal projection of the first sub-color filter on the pixel definition layer and a corresponding pixel opening is a first distance; a distance between an edge of an orthogonal projection of the second color filter and the third color filter on the pixel definition layer and a corresponding pixel opening is a second distance; and the first distance is greater than the second distance;
wherein a refractive index of the black matrix is greater than a refractive index of the planarization layer, and a refractive index of the fourth color filter is between the refractive index of the black matrix and the refractive index of the planarization layer.

11. The display panel of claim 10, wherein the color filter layer further comprises a black matrix positioned between two adjacent color filters of the plurality of color filters, the second sub-color filter is positioned at one side of the black matrix facing away the substrate; the first sub-color filter comprises a middle color filter and an edge color filter, an orthogonal projection of the middle color filter on the substrate covers the pixel openings, the edge color filter is positioned at one side of the black matrix facing away the substrate;
wherein an orthogonal projection of the edge color filter on the black matrix is larger than an orthogonal projection of the second color filter and the third color filter on the black matrix.

12. The display panel of claim 11, wherein one edge of the second sub-color filter close to the second color filter is stacked with the second color filter; and one edge of the second sub-color filter close to the third color filter is stacked with the third color filter.

13. The display panel of claim 11, wherein a gap exists between one edge of the second sub-color filter close to the second color filter and the second color filter; and a gap exists between one edge of the second sub-color filter close to the third color filter and the third color filter.

14. The display panel of claim 10, wherein the orthogonal projection of the first sub-color filter on the pixel definition layer has a circular shape, an oval shape or a polygon shape.

15. The display panel of claim 10, wherein each of the first color filter, the second color filter and the third color filter is one of a red color filter, a blue color filter and a green color filter.

16. The display panel of claim 15, wherein the plurality of light emitting pixels comprise a red pixel, a green pixel and a blue pixel, the red pixel is correspondingly positioned to the red color filter, the green pixel is correspondingly positioned to the green color filter, and the blue pixel is correspondingly positioned to the blue color filter; wherein the red pixel is arranged 180 degrees with the green pixel as a center, the blue pixel is arranged 180 degrees with the green pixel as a center, and the red pixel and the blue pixel are arranged in a same row or a same row at one side of the green pixel.

17. The display panel of claim 16, wherein a ratio range of white balance factors of the red color filter, the green color filter and the blue color filter is 1:0.40:1.35-1:0.70:2.0.

18. The display panel of claim 10, further comprising:
a driving circuit layer, positioned between the substrate and the light emitting layer;
a package layer, covering one side of the light emitting layer facing away the substrate;
a touch control layer, positioned at one side of the package layer facing away the substrate, wherein the color filter layer is positioned at one side of the touch control layer facing away the substrate;
an adhesive layer, positioned at one side of the planarization layer facing away the substrate; and
a cover plate, positioned at one side of the adhesive layer facing away the substrate.

19. A display device, comprising a display panel comprising:
a substrate;
a pixel definition layer, positioned at one side of the substrate and provided with a plurality of pixel openings;
a light emitting layer, positioned in the plurality of pixel openings, the light emitting layer comprising a plurality of light emitting pixels;
a color filter layer, positioned at one side of the light emitting layer facing away the substrate, the color filter layer comprising a plurality of color filters respectively corresponding to plurality of pixel openings, the plurality of color filters comprising a first color filter, a second color filter and a third color filter of different colors, the first color filter comprising a first sub-color filter and a second sub-color filter, and the second sub-color filter is positioned between the second color filter and the third color filter;
a planarization layer, covering one side of the color filter layer facing away the substrate; and
a fourth color filter, positioned at one side of the second color filter facing away the substrate;
wherein a distance between an edge of an orthogonal projection of the first sub-color filter on the pixel definition layer and a corresponding pixel opening is a first distance; a distance between an edge of an orthogonal projection of the second color filter and the third color filter on the pixel definition layer and a corresponding pixel opening is a second distance; and the first distance is greater than the second distance;
wherein a refractive index of the black matrix is greater than a refractive index of the planarization layer, and a refractive index of the fourth color filter is between the refractive index of the black matrix and the refractive index of the planarization layer.

* * * * *